(12) United States Patent  
Danovitch et al.

(10) Patent No.: US 7,473,618 B1
(45) Date of Patent: Jan. 6, 2009

(54) TEMPORARY STRUCTURE TO REDUCE STRESS AND WARPAGE IN A FLIP CHIP ORGANIC PACKAGE

(75) Inventors: David Danovitch, Canton de Granby (CA); Julien Sylvestre, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/107,316

(22) Filed: Apr. 22, 2008

(51) Int. Cl.
*H01L 21/30* (2006.01)

(52) U.S. Cl. .................. 438/458; 438/457; 438/456; 438/455; 438/E23.112

(58) Field of Classification Search ......... 438/106–127, 438/455–465, 611–617, 25–26, 33
See application file for complete search history.

(56) References Cited

U.S. PATENT DOCUMENTS

| | | | |
|---|---|---|---|
| 5,239,448 A | 8/1993 | Perkins et al. | |
| 5,270,371 A | 12/1993 | Cole et al. | |
| 5,838,063 A | 11/1998 | Sylvester | |
| 5,863,830 A | 1/1999 | Bruel et al. | |
| 5,900,675 A | 5/1999 | Appelt et al. | |
| 6,166,434 A | 12/2000 | Desai et al. | |
| 6,501,171 B2 | 12/2002 | Farquhar et al. | |
| 6,696,343 B1 | 2/2004 | Chinthakindi et al. | |
| 6,747,331 B2 | 6/2004 | Infantolino et al. | |
| 7,144,756 B1 | 12/2006 | Wang et al. | |
| 2003/0210531 A1 | 11/2003 | Alcoe et al. | |
| 2004/0155339 A1 | 8/2004 | Infantolino et al. | |
| 2004/0238115 A1 | 12/2004 | Matsuno et al. | |
| 2006/0014309 A1 | 1/2006 | Sachdev et al. | |
| 2006/0065984 A1 | 3/2006 | Matayabas, Jr. et al. | |
| 2006/0255472 A1* | 11/2006 | Ohshima | 257/778 |
| 2007/0059951 A1 | 3/2007 | Volant et al. | |
| 2007/0108583 A1 | 5/2007 | Shim II, et al. | |
| 2008/0036061 A1 | 2/2008 | Chainer | |
| 2008/0088335 A1 | 4/2008 | Blanchet et al. | |
| 2008/0111234 A1* | 5/2008 | Hua et al. | 257/713 |

OTHER PUBLICATIONS

"Flip-Chip Attach is on the Attack", Glenda Derman; *Electronic Engineering Times*, n970, p. 67; 1997.

(Continued)

*Primary Examiner*—Dung A. Le
(74) *Attorney, Agent, or Firm*—Oppenheimer Wolff & Donnelly LLP; Adam P. Kiedrowski

(57) ABSTRACT

A method for reducing stress and warpage in flip chip packages comprising providing a flip chip package including an organic substrate, an integrated circuit chip, and a cap member, providing a temporary structure having a coefficient of thermal expansion that is substantially similar to a coefficient of thermal expansion of the integrated circuit chip, soldering a bottom side of the organic substrate to a top side of the temporary structure, bonding a bottom side of the integrated circuit chip to a top side of the organic substrate with controlled chip collapse columns, coupling the cap member to the top side of the organic substrate, applying force to the flip chip package in a first direction, and applying force to the temporary structure in a second direction opposite the first direction in order to shear the top side of the temporary structure from the bottom side of the organic substrate to remove the temporary structure from the flip chip package.

1 Claim, 4 Drawing Sheets

OTHER PUBLICATIONS

"KGD SRAMs Feature Temp Carriers—Bare Die Parts Aimed at Mobile, High-Performance Computing", Darrell Dunn; *Electronic Buyer's News*, n1054, p. 26, 1997.

"Direct Chip-Attach Appears Most Effective", Glen Yager; *Electronic Engineering Times*, n907, p. 58; 1996.

"Flip Chip Organic Substrate with Metal Column", James J.D. Lan, et al.; 2002 Electronic Components and Technology Conference; pp. 95-99; IEEE cat n 02cg3734-5.

"Development of a TAB (TCP) Ball Grid Array Package", J. Ewanich, et al.; Proceedings of the International Electronics Packaging Conference 1995 IEPS, Wheaton, IL, USA; pp. 588-594; Sep. 24-27, 1995.

"Flexible Organic Field-Effect Transistors Fabricated by the Electrode-Peeling Transfer with an Assist of Self-Assembled Monolayer", Katsuhiko Fujita, et al.; *Applied Physics Letters*, v82n24, pp. 4373-4375; Jun. 16, 2003.

"High Density Compliant Die-Package Interconnects", Sriram Muthukumar, et al.; 2006 Electronic Components and Technology Conference Proceedings—IEEE 56th Electronic Components and Technology Conference v2006.

"A Study on Coining Processes of Solder Bumps on Organic Substrates", Jae-Woong Jah, et al.; *Transactions on Electronics Packaging Manufacturing*, v26n2, Apr. 2003.

"Large Displacement Electrostatic Micromirror Fabricated Using Solder Flip Chip Bonding", Takahiro Miki, et al.; 2004 Inter Society Conference on Thermal Phenomena; Dept. of Mechanical Engineering Yokohama National University, Hodogaya-ku, Yokohama 240-8501, Japan; 2004 IEEE.

Office Communication dated Jul. 21, 2008 for U.S. Appl. No. 12/106,911.

* cited by examiner

TEMPORARY STRUCTURE TO REDUCE STRESS AND WARPAGE IN A FLIP CHIP ORGANIC PACKAGE

FIELD OF THE INVENTION

The present invention relates in general to flip chip packages, and more particularly, to a temporary structure used to reduce stress and warpage in flip chip packages.

BACKGROUND OF THE INVENTION

In organic flip chip packages, there exists a significant difference in the Coefficient of Thermal Expansion (CTE) between an Integrated Circuit (IC) chip and the organic substrate to which it is interconnected by means of small solder joints, which may be generally referred to as Controlled Chip Collapse Columns (C4s). This mismatch in CTE imposes large strains on the C4s and/or the underlying circuitry of the IC chip, thereby compromising yield (e.g. failure during temperature excursions such as solder reflow for the C4 interconnections) and reliability (e.g. failure during application temperature excursions). This fundamental issue has been somewhat mitigated by the use of underfill materials in the gap between the IC chip, the organic substrate, and the C4s. The underfill material provides reinforcement to the inherent fatigue resistance of the C4s. One drawback of this mitigation approach is that the underfill material, once cured, polymerized, and adhesively bonded to the C4s, IC chip, and substrate, limits the lateral (X-Y) contraction of the substrate during the cool down cycle of underfill cure, thereby causing: (1) the substrate to deform in the Z-direction (warpage); and (2) high residual stresses between the underfill and the IC chip, especially at the IC corners where the Distance to Neutral Point (DNP) (i.e., center point of the IC chip) is highest. These issues are exacerbated with higher densities (i.e., smaller C4s), larger chips (i.e., higher DNPs) and less compliant C4 materials (such as certain Pb-free solders), all of which are current trends in micro-electronic packaging. Moreover, if the underfill is not present during initial joining of the IC chip to the substrate, then no such protection is afforded at this stage.

Solutions have been offered and/or developed to further mitigate the above CTE mismatch and/or further improve upon the underfill solution. For example, certain underfills exist that may be applied prior to the formation of the C4 joints between the IC chip and the organic substrate, such as wafer level underfills and "No Flow" underfills. However, drawbacks to these solutions include increased difficulties in affecting the initial C4 joints and compromised reliability attributes. Many underfill formulations have been and continue to be developed in an effort to reduce the aforementioned warpage and stress effects, but there is usually a trade-off in either the protection afforded the C4s or the protection afforded the underlying IC chip circuitry. Other solutions relate to maintaining a Z-direction force during certain aspects of package assembly such as when the heat spreader is attached. While providing improved resistance against warpage, such a process increases assembly cost and imparts greater stresses to other interfaces.

Another issue with the aforementioned trends in micro-electronic packaging, and specifically involving higher densities and larger IC chips, is that organic substrates are becoming less co-planar due to increased warping prior to any C4 joining to the IC chip. Furthermore, some advances in organic substrate development intended to increase electrical performance have introduced new substrate structures that tend to be less co-planar. However, the greater the amount of warpage, the more difficult it becomes to effect 100% joining efficiency of all C4 interconnections between the IC chip and the substrate. This is especially true when using smaller C4 interconnection structures, which include smaller C4 solder bumps on the IC chip and smaller solder receiving pads on the organic substrate.

Based on the foregoing, there exists a need for an improved system and method for reducing stress and warpage in flip chip packages.

BRIEF SUMMARY OF THE INVENTION

The present invention solves the foregoing problems by providing a method for reducing stress and warpage in flip chip packages that includes providing a flip chip package including an organic substrate, an integrated circuit chip, and a cap member, providing a temporary structure having a coefficient of thermal expansion that is substantially similar to a coefficient of thermal expansion of the integrated circuit chip, soldering a bottom side of the organic substrate to a top side of the temporary structure, bonding a bottom side of the integrated circuit chip to a top side of the organic substrate with controlled chip collapse columns, coupling the cap member to the top side of the organic substrate, applying force to the flip chip package in a first direction, and applying force to the temporary structure in a second direction opposite the first direction in order to shear the top side of the temporary structure from the bottom side of the organic substrate to remove the temporary structure from the flip chip package.

DETAILED DESCRIPTION OF THE INVENTION

The present invention will be described in detail with reference to the figures below. However, generally speaking, the present invention is a structure and method for reducing stress and warpage in flip chip packages. The invention includes providing a temporary structure having a CTE similar to that of an IC chip of a flip chip package, bonding the temporary structure to an organic substrate prior to interconnecting the IC chip and organic substrate with C4s, and "de-bonding" the temporary structure from the flip chip package at some stage prior to interconnecting the final flip chip package assembly to its corresponding card, board or other receiving medium. This invention provides numerous benefits, including but not limited to the following: reducing substrate warpage prior to IC chip assembly; reducing stresses imparted to underlying IC chip circuitry during IC chip joining without the need of a pre-applied underfill; reducing package warpage during underfill cure/cool down, thus averting the need for the application of force during heat spreader assembly; and reducing IC chip corner stresses.

Figure 1:
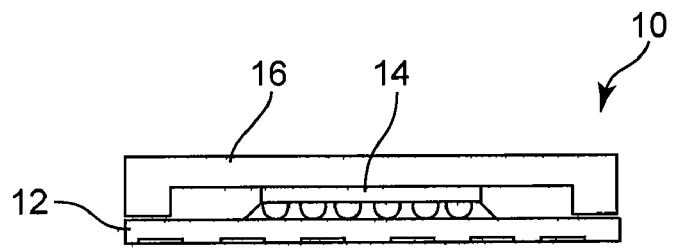
FIG. 1 is a diagram illustrating one embodiment of a flip chip package assembly, which generally includes an organic substrate coupled to an integrated circuit chip.

FIG. 1 is a diagram illustrating one embodiment of a flip chip package 10, which generally includes organic substrate 12 coupled to IC chip 14. As will be discussed in more detail to follow, organic substrate 12 may typically be coupled to IC chip 14 by soldering. Optionally, flip chip package 10 may include cap 16, which may be coupled to a top surface of organic substrate 12 to encase IC chip 14.

Figure 2A:
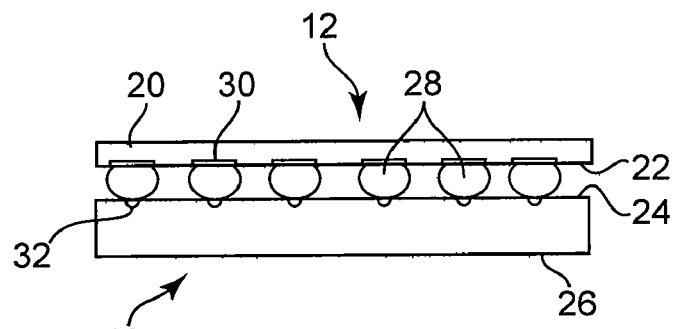
FIGS. 2A-2E are diagrams illustrating a first embodiment of an improved method for reducing stress and warpage during a flip chip package assembly process.

One representative embodiment of an improved method for reducing stress and warpage in flip chip packages in accordance with the present invention will now be described in reference to FIGS. 2A-2E. In particular, FIG. 2A is a diagram illustrating a first step of a flip chip package assembly process in accordance with the present invention wherein a temporary structure 18 is coupled to organic substrate 12 of flip chip package 10. As shown in FIG. 2A, organic substrate 12 includes top surface 20 and bottom surface 22. Similarly, temporary structure 18 also includes top surface 24 and bottom surface 26. During manufacture of flip chip package 10, bottom surface 22 of organic substrate 12 is first bonded to top surface 24 of temporary structure 18. Organic substrate 12 may be bonded to temporary structure 18 using a variety of materials and bonding means. In one exemplary bonding means, as illustrated in FIG. 2A, solder interconnections 28 may be provided on top surface 24 of temporary structure 18 in a pattern corresponding, in a mirror image fashion, to a plurality of solder pads 30 on bottom surface 22 of organic substrate 12. Top surface 24 of temporary structure 18 may also include a plurality of solder pads 32 in a pattern similar to that of pads 30 on organic substrate 12. However, as will be discussed in further detail to follow, solder pads 32 on top surface 24 of temporary structure 18 are preferably sized at least slightly smaller than the pads 30 on bottom surface 22 of organic substrate 12 to assist in the removal process of temporary structure 18 from flip chip package 10.

Temporary structure 18 has a CTE that is preferably significantly lower than the CTE of organic substrate 12. For example, an organic substrate may have a CTE of about 17.0 ppm/° C. A typical temporary structure in accordance with the present invention may have a CTE of less than about 10 ppm/° C., and ideally less than about 5 ppm/° C. The CTE of the temporary thus approaches the CTE of the silicon IC chip, which may be about 3.0 ppm/° C. Temporary structure 18 is preferably a stiff material that may be easily manufactured such that it is substantially flat, with little to no warpage. Furthermore, temporary structure 18 is preferably thick enough to limit the thermal expansion of organic substrate 12 without significant amounts of deformation. Temporary structure 18 may therefore be formed from numerous materials including, but not limited to, quartz, boro-silicate glass, pure silicon in wafer form, or any suitable material that would meet the above criteria.

This process of bonding organic substrate 12 to temporary structure 18 reduces the warpage of organic substrate 12, including the IC chip attachment region on top surface 20 of organic substrate 12, prior to the subsequent step of bonding IC chip 14 to organic substrate 12. The reduced warpage is realized because of the existence of additional structure on the bottom side of organic substrate 12 that is significantly more rigid than organic substrate 12. As a result of the reduction in warpage of organic substrate 12, the subsequent IC chip bonding process may be made more efficient, with greater probability of 100% C4 interconnection and the corresponding quality thereof.

Figure 2B:
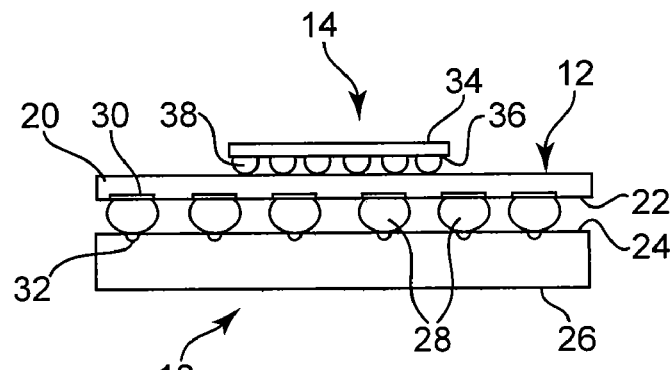

FIG. 2B is a diagram illustrating a second step of a flip chip package assembly process in accordance with the present invention, wherein IC chip 14 is bonded to organic substrate 12. In particular, IC chip 14 generally includes top surface 34 and bottom surface 36. Bottom surface 36 of IC chip 14 may be bonded to top surface 20 of organic substrate 12 via any suitable interconnection means. However, IC chip 14 is preferably bonded to organic substrate 12 via C4 interconnections 38.

As those skilled in the art will appreciate, one effect of bonding organic substrate 12 to temporary structure 18 prior to interconnecting IC chip 14 and organic substrate 12 is to provide restricted movement of such a "composite structure," as compared to organic substrate 12 alone, during thermal excursions. As a result, during the initial bonding by C4 interconnection of bottom surface 36 of IC chip 14 to top surface 20 of organic substrate 12, the movement of organic substrate 12 relative to IC chip 14 is reduced, thereby causing less lateral (X-Y) movement of the C4 joints and in turn imparting less strain on the underlying circuitry in IC chip 14.

Figure 2C:
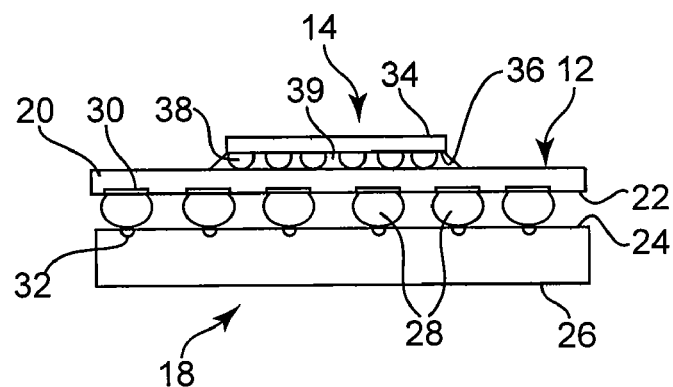

FIG. 2C is a diagram illustrating a third step of a flip chip package assembly process in accordance with the present invention wherein the gap between chip 14 and organic substrate 12 is filled with underfill 39. Organic substrate 12 and IC chip 14 remain substantially flat with minimal warpage as a result of bonding IC chip 14 to organic substrate 12 while temporary structure 18 is bonded to bottom side 22 of organic substrate 12. Furthermore, the lower resultant CTE of the composite structure (i.e., temporary structure 18 bonded to organic substrate 12) may reduce relative movement between IC chip 14 and organic substrate 12 during the underfill cure cycle, hence reducing warpage of IC chip 14 and stresses imparted on IC chip 14, particularly at the corners of IC chip 14.

Figure 2D:
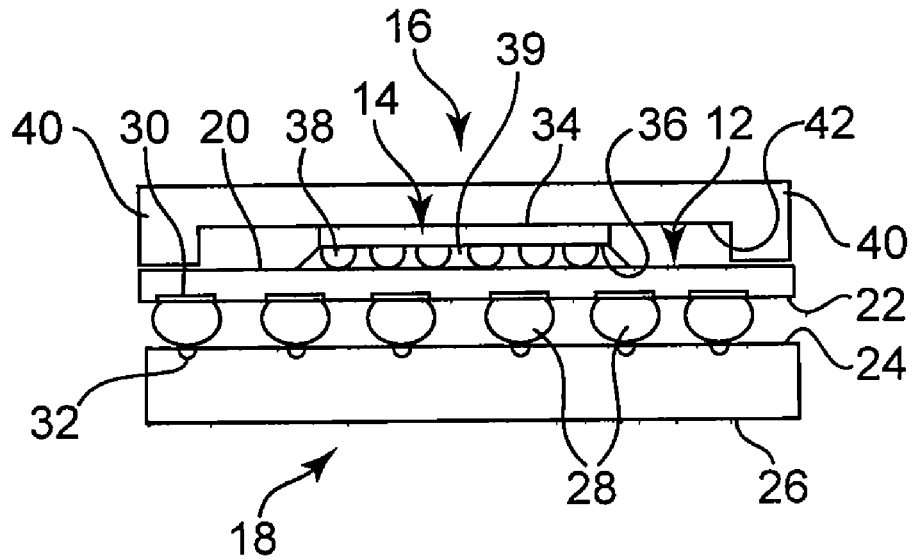

FIG. 2D is a diagram illustrating a fourth step of a flip chip package assembly process in accordance with the present invention, wherein cap 16 is coupled to organic substrate 12 by means of appropriate thermal and structural adhesives. For example, cap 16 may include foot portion 40 and middle section 42. Foot portion 40 may be coupled to top surface 20 of organic substrate 12 with a structural adhesive while IC chip 14 may be coupled to middle section 42 of cap 16 with a thermal adhesive. Cap 16 may thereby serve several functions including, but not limited to, acting as a "heat spreader" to assist in heat dissipation from IC chip 14 and providing additional structural support for organic substrate 12. Moreover, because of the fact that the top surface of IC chip 14 may be substantially flatter due to the presence of temporary structure 18 bonded to organic substrate 12 during the cap coupling process, the thermal interface between IC chip 14 and middle section 42 of cap 16 may be more consistent, thereby enhancing the function of heat dissipation. Although any suitable material may be used, cap 16 may preferably be formed from Aluminum or Copper.

As those skilled in the art will appreciate, a cap member such as cap 16 is not a necessary component of a flip chip package. Thus, in other embodiments, cap 16 may be omitted from flip chip package 10 without departing form the intended scope of the present invention. Moreover, other embodiments may contain alternatively designed caps to suit a particular application.

Figure 2E:
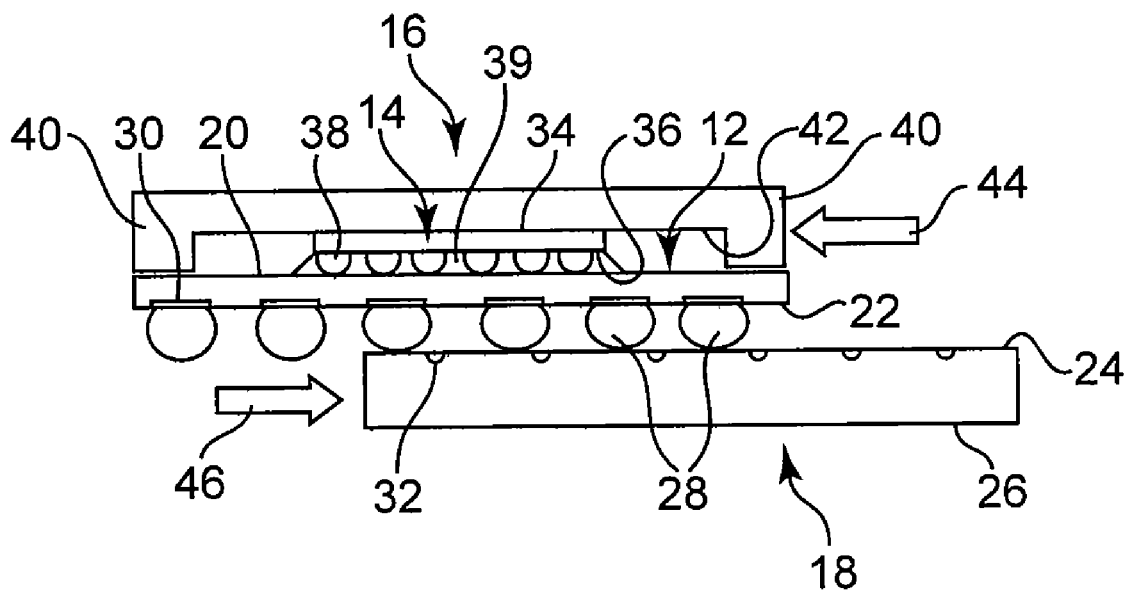

Finally, FIG. 2E is a diagram illustrating a fifth step of a flip chip package assembly process in accordance with the present invention, wherein temporary structure 18 is removed from flip chip package 10. Although numerous methods may be used in order to remove temporary structure 18, one exemplary removal process involves "shearing" temporary structure 18 from flip chip package 10.

As shown in FIG. 2E, a first force may be applied to flip chip package 10 in a first direction 44, while a second, opposing force may be simultaneously applied to temporary structure 18 in a second direction 46. As previously discussed, pads 32 on top surface 24 of temporary structure 18 are smaller in size than corresponding pads 30 on bottom surface 22 of organic substrate 12. These smaller pads 32 of temporary structure 18 are designed such that they are the weak spot of solder interconnections 28. As a result, when opposing forces are applied to flip chip package 10 and temporary structure 18, the smaller pads 32 of temporary structure 18 encourage separation at those points. Although only one exemplary separation method has been described herein, those skilled in the art will appreciate that any suitable separation method may be used.

One important aspect of the present invention is that temporary structure 18 is not permanently bonded to organic substrate 12. In other words, it is important that temporary structure 18 may be removed prior to the point at which organic substrate 12 and attached IC chip 14 are attached to a card, such as a Printed Circuit Board (PCB). By designing temporary structure 18 as a temporary "carrier" that may be bonded to organic substrate 12 and later removed toward the end of the assembly process, the assembled flip chip package 10 may subsequently possess properties that do not otherwise impact the process of attaching the flip chip package to the card. Moreover, the assembled flip chip package 10 may in fact possess properties that facilitate the process of attaching the flip chip package to the card, while also improving the resultant reliability of such an assembled structure.

The above discussion focused on temporary structures that are bonded to an organic substrate by means of soldering. However, the temporary structure may be bonded to the organic substrate by other suitable means as will be discussed with reference to an alternative embodiment of the present invention. In particular, an alternative embodiment of the improved method for reducing stress and warpage in flip chip packages in accordance with the present invention will now be described in reference to FIGS. 3A-3E. For purposes of convenience and discussion, the assembly process will be described in reference to flip chip package 10 and temporary structure 18 previously described, the only difference being that solder pads 32 have been removed from top surface 24 of temporary structure 18.

Figure 3A:
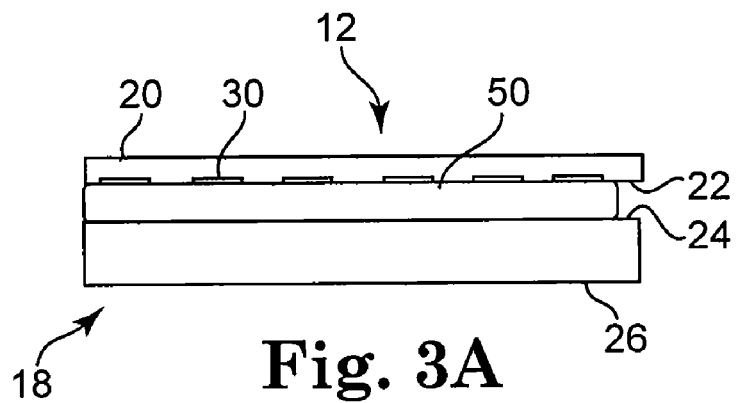
FIGS. 3A-3E are diagrams illustrating a second embodiment of an improved method for reducing stress and warpage during a flip chip package assembly process.

FIG. 3A is a diagram illustrating a first step of the alternative flip chip package assembly process in accordance with the present invention wherein temporary structure 18 is coupled to organic substrate 12 of flip chip package 10. Similar to the assembly process described above, bottom surface 22 of organic substrate 12 is bonded to top surface 24 of temporary structure 18. However, instead of bonding organic substrate 12 to temporary structure 18 with solder, the alternative assembly process uses a polymer adhesive 50 to bond organic substrate 12 to temporary structure 18.

Organic substrate 12 may be bonded to temporary structure 18 with any type of polymer adhesive. However, it is preferred that the adhesive maintains its bonding properties between organic substrate 12 and temporary structure 18 under high loads and at high temperatures that may exceed 250° C. Furthermore, a proper means of de-bonding organic substrate 12 from temporary structure 18 must exist in order to avoid excessive damage to organic substrate 12 during the separation process, which will be discussed in detail below. In particular, after de-bonding solder pads 30 on bottom surface 22 of organic substrate 12, solder pads 30 must be sufficiently free of contamination from the adhesive and/or de-bonding solvent so that later applied solder balls may properly wet the pads.

A first suitable polymer adhesive may be a silicon adhesive which may be dispensed in various patterns and in thin layers, cured at 150° C., and cleaned using an appropriate solvent. A second suitable polymer adhesive may be an epoxy resin. Epoxy resin may also be dispensed in various patterns and in thin layers, and be cured at room temperature using UV radiation. Furthermore, the mechanical properties of epoxy resins may permit temporary structure 18 to be subsequently sheared from organic substrate 12 without damage to the substrate and without leaving behind residue on solder pads 30.

When applying the adhesive to organic substrate 12 and/or temporary structure 18, the adhesive may be dispensed using standard procedures and in various adhesive "patterns." A first example of an adhesive pattern includes an array of small dots located between pads 30 on bottom surface 22 of organic substrate 12 (i.e., in the "interstitial spaces"). This type of pattern may provide sufficient stiffness for controlling the warpage of organic substrate 12, along with a significant surface area for chemical dissolution, while at the same time minimizing the contamination of pads 30 by the adhesive such that subsequent removal of residual adhesive may not be necessary. A second example of an adhesive pattern includes a continuous film covering substantially the entire bottom surface 22 of organic substrate 12. This type of pattern maximizes stiffness for controlling the warpage of organic substrate 12, but may require a de-bonding process to remove residual adhesive from the bottom pads 30 of organic substrate 12.

Once the adhesive has been applied between organic substrate 12 and temporary structure 18, and temporary structure 18 is positioned at the desirable location relative to organic substrate 12, a vertical load is applied to organic substrate 12 in order to "flatten" the substrate. This load may be maintained throughout the entire curing process of the adhesive. Furthermore, the load may be applied directly to organic substrate 12 or through a pressure-equalizing structure, such as an elastomer cushion, in order to protect small structures above the solder mask, including solder bumps.

Figure 3B:
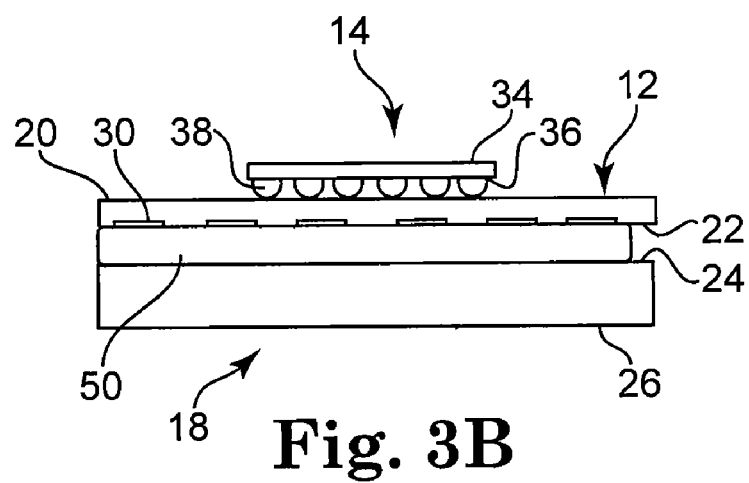

FIG. 3B is a diagram illustrating a second step of the alternative flip chip package assembly process in accordance with the present invention, wherein IC chip 14 is bonded to organic substrate 12. Similar to the assembly process described above in reference to FIGS. 2A-2E, bottom surface 36 of IC chip 14 may be bonded to top surface 20 of organic substrate 12 via any suitable interconnection means, such as with C4 interconnections.

Figure 3C:
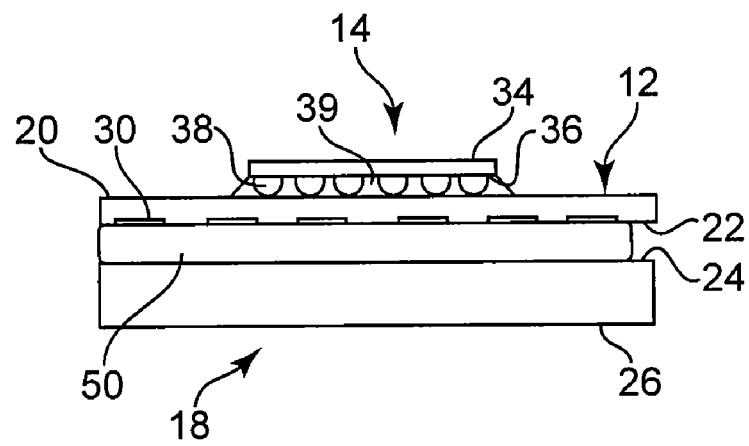

FIG. 3C is a diagram illustrating a third step of a flip chip package assembly process in accordance with the present invention wherein the gap between chip 14 and organic substrate 12 is filled with underfill 39. Once again, organic substrate 12 and IC chip 14 remain substantially flat with minimal warpage as a result of bonding IC chip 14 to organic substrate 12 while temporary structure 18 is bonded to bottom side 22 of organic substrate 12.

Figure 3D:
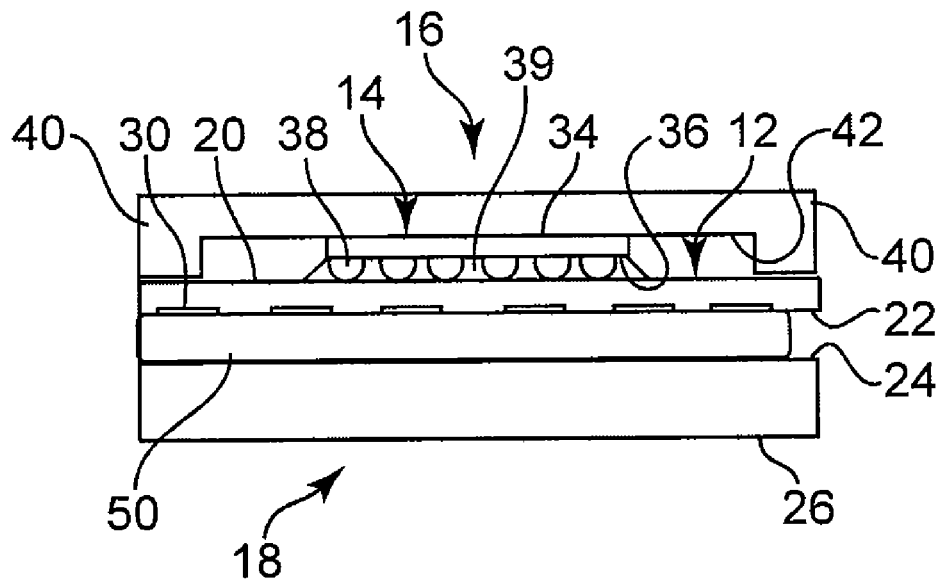

FIG. 3D is a diagram illustrating a fourth step of the alternative flip chip package assembly process in accordance with the present invention, wherein cap 16 is coupled to organic substrate 12 using a process similar to that previously described in reference to FIGS. 2A-2E.

Figure 3E:
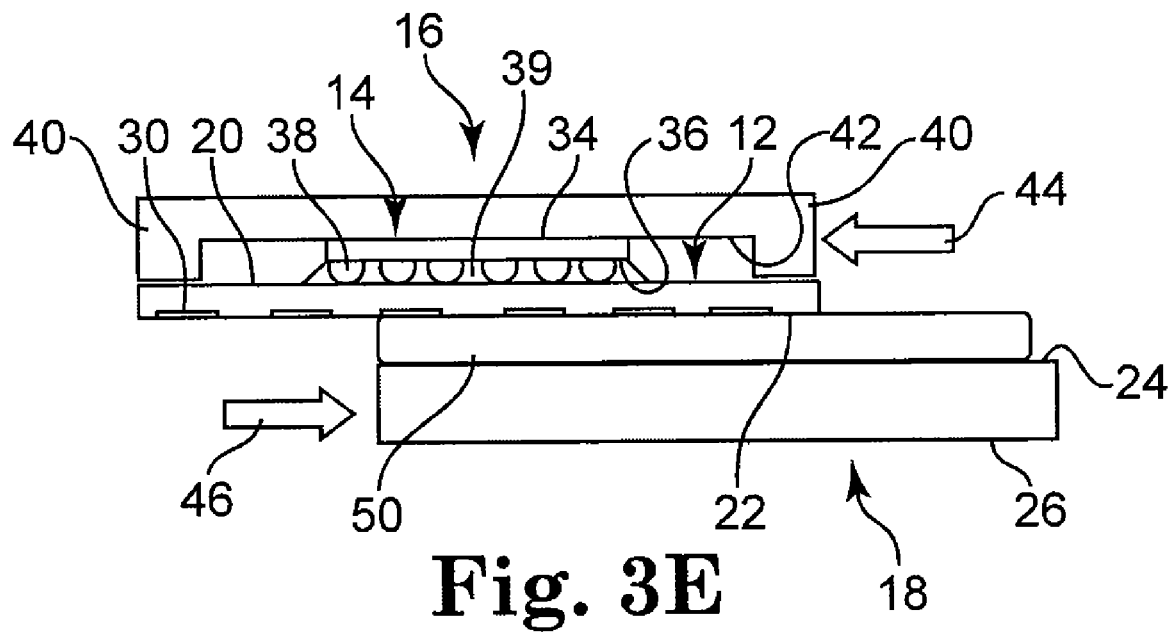

Finally, FIG. 3E is a diagram illustrating a fifth step of the alternative flip chip package assembly process in accordance with the present invention, wherein temporary structure 18 is removed from flip chip package 10. As shown in FIG. 3D, a first force may be applied to flip chip package 10 in a first direction 44, while a second, opposing force may be simultaneously applied to temporary structure 18 in a second direction 46. As a result, when opposing forces are applied to flip chip package 10 and temporary structure 18, temporary structure 18 may be "sheared" from organic substrate 12 in order to remove temporary structure 18 from flip chip package 10.

This "shearing" process may be performed with the adhesive at any temperature, such as at room temperature. However, heating the adhesive to some elevated temperature above room temperature may allow temporary structure 18 to be more easily separated from flip chip package 10.

Another de-bonding process that may be used involves applying radiation to the adhesive. In particular, radiation may be transmitted through temporary structure 18 in order to break the polymer bonds and de-couple organic substrate 12 from temporary structure 18.

Yet another de-bonding process that may be used involves applying a solvent to weaken the polymer bonds. In particular, a solvent may be applied to the visible portions of the adhesive in between organic substrate 12 and temporary structure 18. Alternatively, temporary structure 18 may have one or more apertures extending therethrough for dispensing the solvent at various adhesive locations other than just the outer, visible edge portions.

Although only a few exemplary de-bonding methods have been described, those skilled in the art will appreciate that any suitable de-bonding method may be used without departing from the intended scope of the present invention.

After the de-bonding step, there may be some residue left on bottom surface 22 of organic substrate 12 from the adhesive. Therefore, organic substrate 12 may optionally be cleaned or conditioned depending upon the type of adhesive, the adhesive removal process used, and the needs of the subsequent operations such as a Ball Grid Array (BGA) attachment process, a Land Grid Array (LGA) actuation/mating process, and the like. Alternatively, the adhesive residue may be left on bottom surface 22 of organic substrate 12 if the residue does not affect other portions of the manufacturing process or the operation of flip chip package 10.

Although the present invention has been described with reference to preferred embodiments, workers skilled in the art will recognize that changes may be made in form and detail without departing from the spirit and scope of the invention.

What is claimed is:

1. A method for reducing stress and warpage in flip chip packages comprising:

providing a flip chip package, the flip chip package including an organic substrate, an integrated circuit chip, and a cap member;

providing a temporary structure having a coefficient of thermal expansion that is substantially similar to a coefficient of thermal expansion of the integrated circuit chip;

soldering a bottom side of the organic substrate to a top side of the temporary structure, wherein solder interconnections are applied to a plurality of solder pads on the top side of the temporary structure, the position of the solder pads on the top side of the temporary structure mirroring the position of a plurality of solder pads on the bottom side of the organic substrate;

bonding a bottom side of the integrated circuit chip to a top side of the organic substrate with controlled chip collapse columns;

coupling the cap member to the top side of the organic substrate;

applying a first force to the flip chip package in a first direction; and applying a second force to the temporary structure in a second direction opposite the first direction in order to shear the top side of the temporary structure from the bottom side of the organic substrate to remove the temporary structure from the flip chip package, wherein the first and second forces are parallel to the top side of the temporary structure, and wherein upon removal of the temporary structure from the flip chip package the solder interconnections remain on the solder pads on the bottom side of the organic substrate.

* * * * *